US010250035B2

(12) United States Patent
Avritzer et al.

(10) Patent No.: US 10,250,035 B2
(45) Date of Patent: Apr. 2, 2019

(54) HOLISTIC OPTIMIZATION OF DISTRIBUTION AUTOMATION USING SURVIVABILITY MODELING TO SUPPORT STORM HARDENING

(71) Applicant: Siemens Aktiengesellschaft, Munich (DE)

(72) Inventors: Alberto Avritzer, Mountainside, NJ (US); Sindhu Suresh, Monroe Township, NJ (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 330 days.

(21) Appl. No.: 15/036,084

(22) PCT Filed: Nov. 18, 2014

(86) PCT No.: PCT/US2014/066047
§ 371 (c)(1),
(2) Date: May 12, 2016

(87) PCT Pub. No.: WO2015/077196
PCT Pub. Date: May 28, 2015

(65) Prior Publication Data
US 2016/0301207 A1    Oct. 13, 2016

Related U.S. Application Data

(60) Provisional application No. 61/906,135, filed on Nov. 19, 2013.

(51) Int. Cl.
*H02J 3/00*         (2006.01)
*G06F 17/50*       (2006.01)
(Continued)

(52) U.S. Cl.
CPC .......... *H02J 3/005* (2013.01); *G06F 17/5009* (2013.01); *G06Q 10/0637* (2013.01);
(Continued)

(58) Field of Classification Search
CPC ....... H02J 3/005; H02J 3/006; G06F 17/5009; G06Q 10/0637
(Continued)

(56) References Cited

U.S. PATENT DOCUMENTS 6,549,880 B1 *   4/2003   Willoughby ............... H02J 3/00
                                                                    700/22
8,521,337 B1 *   8/2013   Johnson .................. H02J 3/008
                                                                    370/252
(Continued)

OTHER PUBLICATIONS

Arif Islam ("Smart Grid Reliability Assessment Under Variable Weather Conditions", University of South Florida, 2009, pp. 1-172).*
(Continued)

*Primary Examiner* — Kamini S Shah
*Assistant Examiner* — Iftekhar A Khan

(57) ABSTRACT

Improvements to a distributed automation power grid are selected to improve storm survivability. Using historical information about storms, link sets are determined that, when added to the power grid, would restore connectivity after damage by each of the storms. One of the link sets is then selected based on costs and rewards, and is added to a grid representation. Survivability of the modified grid representation is then estimated, and additional link sets are determined and selected until survivability surpasses a minimum level or a budget is exceeded.

16 Claims, 12 Drawing Sheets

(51) Int. Cl.
*G06Q 10/06* (2012.01)
*G06Q 50/06* (2012.01)

(52) U.S. Cl.
CPC .............. *G06Q 50/06* (2013.01); *H02J 3/006* (2013.01); *H02J 2003/007* (2013.01); *Y02E 60/76* (2013.01); *Y04S 10/525* (2013.01); *Y04S 40/22* (2013.01)

(58) Field of Classification Search
USPC .......................................................... 703/2
See application file for complete search history.

(56) References Cited

U.S. PATENT DOCUMENTS

| | | | | |
|---|---|---|---|---|
| 9,230,289 | B2* | 1/2016 | Omitaomu | G06Q 50/06 |
| 9,536,214 | B2* | 1/2017 | Heng | G06N 7/005 |
| 2008/0077336 | A1* | 3/2008 | Fernandes | G01R 15/142 |
| | | | | 702/57 |
| 2008/0319724 | A1* | 12/2008 | Domijan, Jr. | G01W 1/06 |
| | | | | 703/2 |
| 2009/0319687 | A1* | 12/2009 | Goldstein | G06F 9/5083 |
| | | | | 709/241 |
| 2010/0131202 | A1* | 5/2010 | Dannevik | G01W 1/00 |
| | | | | 702/3 |
| 2010/0177450 | A1* | 7/2010 | Holcomb | H02H 9/023 |
| | | | | 361/19 |
| 2011/0015801 | A1* | 1/2011 | Mazzarella | G06Q 30/018 |
| | | | | 700/297 |
| 2011/0072315 | A1* | 3/2011 | Avritzer | G06F 11/1438 |
| | | | | 714/47.1 |
| 2012/0158327 | A1* | 6/2012 | Hurri | G06Q 50/06 |
| | | | | 702/62 |
| 2012/0179301 | A1* | 7/2012 | Aivaliotis | H02J 3/00 |
| | | | | 700/286 |
| 2012/0265502 | A1* | 10/2012 | Omitaomu | G06Q 50/06 |
| | | | | 703/2 |
| 2012/0316696 | A1* | 12/2012 | Boardman | H02J 13/0079 |
| | | | | 700/297 |
| 2013/0191320 | A1* | 7/2013 | Avritzer | G06N 7/005 |
| | | | | 706/52 |
| 2015/0032278 | A1* | 1/2015 | Bhageria | H02J 4/00 |
| | | | | 700/295 |
| 2015/0276253 | A1* | 10/2015 | Montalvo | G06Q 10/06 |
| | | | | 700/276 |
| 2015/0331063 | A1* | 11/2015 | Ji | H02J 3/00 |
| | | | | 702/58 |

OTHER PUBLICATIONS

Neumayer et al. Hereafter Neumayer ("Geographic Max-Flow and Min-Cut Under a Circular Disk Failure Model", IEEE, 2012, pp. 2736-2740).*
Billinton et al. (Extreme Adverse Weather Modeling in Transmission and Distribution System Reliability Evaluation, 2002, PSCC, pp. 1-7).*
Janak Raj Acharya (Weather Effect Considerations in Reliability Evaluation of Electrical Transmission and Distribution Systems, Thesis, University of Saskatchewan, 2005, pp. 1-169).*
Brown et al. (Distribution System Reliability Assessment Using Hierarchical Markov Modeling,1996, IEEE, pp. 1929-1934).*
Koziolek et al. (Common analysis framework for smart distribution networks applied to survivability analysis of distribution automation, 2012, University of Zurich, pp. 1-8).*
PCT International Search Report dated Mar. 2, 2015; PCT/US2014/066047; Filing Date: Nov. 18, 2014; 9 pages.

* cited by examiner (a)

(b)

HOLISTIC OPTIMIZATION OF DISTRIBUTION AUTOMATION USING SURVIVABILITY MODELING TO SUPPORT STORM HARDENING

CROSS-REFERENCE TO RELATED APPLICATIONS

This application claims priority to U.S. provisional application Ser. No. 61/906,135 filed Nov. 19, 2013, the disclosure of which is incorporated by reference herein in its entirety. This application is additionally a continuation-in-part of U.S. patent application Ser. No. 13/568,257, filed on Aug. 7, 2012, the disclosure of which is incorporated by reference herein in its entirety, which application claims priority to U.S. provisional application Ser. No. 61/590,464 filed Jan. 25, 2012 and U.S. provisional application Ser. No. 61/635,416 filed Apr. 19, 2012, the disclosures of which are incorporated by reference herein in their entireties.

BACKGROUND OF THE INVENTION

1. Technical Field

The present disclosure relates to smart grid energy distribution automation networks. More particularly, disclosure describes a holistic optimization approach for the assessment of the impact of multiple distribution automation failures after a major storm.

2. Discussion of the Related Art

Serious storms have historically caused multiple energy grid failures that are often localized in an area affected by the storm. In a distributed automation power distribution environment, or smart grid network, it may be possible to quickly and automatically recover from such multiple failures if the correct grid upgrades and storm hardening investments have been made. Given limited budgets and other constraints, however, it is necessary to select a limited number of grid upgrades and storm hardening projects to be implemented to maximize the likelihood of a quick and automated recovery.

There is a need for a survivability metric to be used in choosing such grid upgrades. Traditionally, the reliability of power systems has been quantified using average metrics, such as System Average Interruption Duration Index ("SAIDI"). Some of the United States public service commissions use SAIDI to assess utilities' compliance with the commission rules. SAIDI was developed to track manual restoration times, and according to Standard 166-1998, the median value for North American utilities is roughly one and a half hours.

In smart grid networks, power failure and restoration events will have a finer level of granularity, due to the deployment of reclosers, which isolate faulty sections, and demand side management system activities, such as distributed generators and demand response application systems. Therefore, there is a need to extend the SAIDI metric, and to develop new models and tools for the accurate computation of customer interruption indexes after power failure events occur, even if the occurrence of such events is rare.

Engineering of distributed automation power grids requires a careful assessment of an expected multiple-failure model. Power engineers presently do not have modeling capabilities to assess the joint impact of multiple failure identification, isolation and restoration based on the distributed automation power grid survivability. There is a need for the ability to assess the impact of multiple failures on distribution automation performance to be able to optimize the investment in the power grid survivability infrastructure.

There is a need to make a holistic assessment of system survivability after a major distribution automation failure event that causes multiple failures. The assessment should take into account the historic storm record as well as the topology and geography of the grid.

SUMMARY OF THE INVENTION

In an exemplary embodiment of the present invention, there is provided a method for selecting improvements to an original distributed automation power grid to improve storm survivability. The original distributed automation power grid is initially identifying as a current circuit. Based on a topology and a geography of the current circuit, and further based on information describing a plurality of historical storms, a plurality of link sets is determined, each link set associated with one of the plurality of historical storms. Also determined are costs and marginal survivability benefits associated with each link set. Each link set represents links that would restore connectivity of the current circuit after damage by the associated storm.

Based on the costs and benefits, a link set is selected from the plurality of link sets. The current circuit is then updated by adding the selected link set, and the costs and benefits of the plurality of oink sets is updated. A phased-recovery survivability model of the current circuit is created using transition probabilities between recovery phases.

A distribution automation survivability metric is determined for the current circuit using the phased-recovery survivability model. The operations are repeated until the distribution automation survivability metric of the current circuit meets a target distribution automation survivability metric. Improvements in the current circuit are selected as the improvements to the original distributed automation power grid to improve storm survivability.

The information describing the plurality of historical storms may be, for each storm, a storm radius of impact and a storm center. Determining a link set associated with each storm may further include: mapping a representation of the current circuit into a labeled graph, wherein labels of the labeled graph represent susceptibilitied of nodes as a function of the storm radius of impact and the storm center; obtaining a disconnected graph by removing nodes of the labeled graph within the storm radius of impact around the storm center; and determining the link set associated with the storm by determining a set of links outside the storm radius of impact around the storm center that, when added to the disconnected graph, restore connectivity.

In another aspect of the invention, non-transitory computer useable media are provided having computer readable instructions stored thereon for execution by a processor to perform operations as described above.

DETAILED DESCRIPTION OF EXEMPLARY EMBODIMENTS

Figure 1:
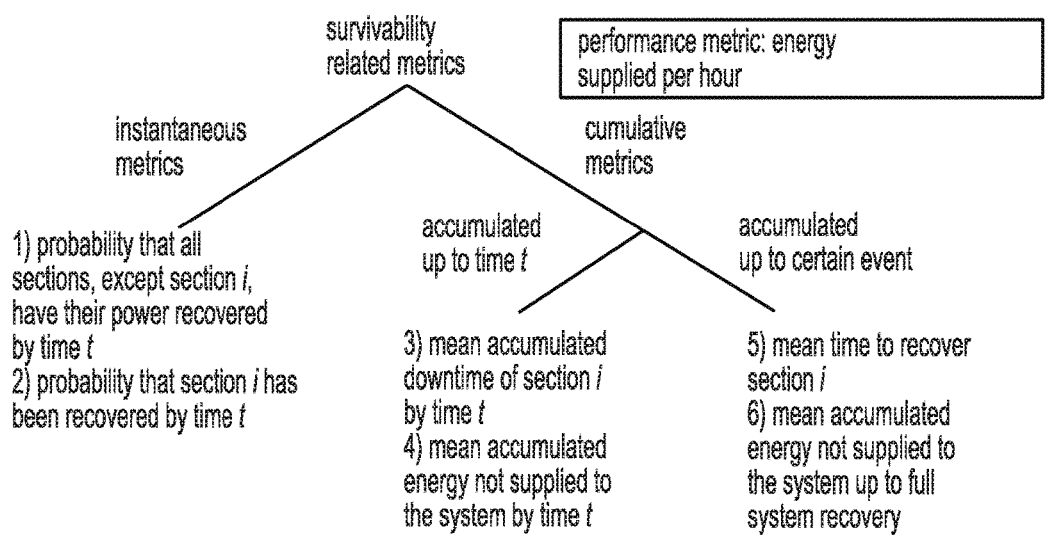
FIG. 1 is a taxonomy of survivability related metrics, according to an exemplary embodiment of the present invention.

In accordance with an exemplary embodiment of the present invention, presented herein is an analytical model to assess the survivability of distributed automation power grids. In this exemplary embodiment, a performability model is used to capture how the system recovers from a failure. The model accounts for the fact that the topology is sectionalized. Given a failure in section i, a key insight is to aggregate the sections of the network that may be fed by backup sources into a single node, denoted by i+. This aggregation allows transient metrics of the network to be efficiently quantified after a failure, also referred to as survivability metrics. For example, the model allows the computation of how the energy not supplied (ENS) after a failure varies over time as a function of available backup power, the demand response application and of the state of the information and communication network.

After a power failure event, some power grid areas of the network may experience restoration times of the order of magnitude of minutes, while other power grid areas may require hours for manual repair events to take place. The model allows for the accurate assessment of the power grid network survivability by tracking the time-dependent state of the system under study.

Some of the contributions of this disclosure are the following:

Survivability model. Presented herein is a Markov chain model that supports the survivability assessment of power grid metrics accounting for the sectionalizing of distribution automation topology, the available excess power, the unreliability of the telecommunications network and the interaction with the demand response application. The model can be generated and solved in a cost-efficient manner.

Implications of system integration. The invention brings awareness to the importance of accurate holistic power engineering that considers the interactions between telecommunications reliability and the reliability benefits of integration with other distribution automation features, such as the integration of failure recovery with demand response. In particular, it is shown that if demand response can be activated after a failure occurs, the reliability of the system significantly increases.

Extension of the SAIDI metric to support distributed automation. The invention also presents an extension of the SAIDI metric that captures the dynamic nature of the smart-grid by taking into account the number of customers impacted by the service interruption, the service impact of the interruption (e.g., Energy not Supplied) and the duration of the recovery period. The analytical solution of the survivability model is used to capture the time spent in each state during the recovery period and the reward associated with each state to capture the service impact of the interruption.

Survivability metrics that can be derived from the inventive model will now be discussed.

Survivability is the ability of a system to continue to function during and after a disturbance. It has been defined by ANSI as the transient performance of a system after an undesirable event. The metrics used to quantify survivability vary according to applications, and depend on a number of factors such as the minimum level of performance necessary for the system to be considered functional, and the maximum acceptable outage duration of a system. Survivability metrics are transient metrics computed after the occurrence of a failure. In the remainder of this disclosure, time t refers to the time since a failure occurred and is measured in hours.

In an exemplary embodiment of the present invention, survivability metrics are computed with respect to a measure of interest M, also referred to as the performance metric. In the realm of power systems, an example of the performance metric M of interest could be the energy supplied per hour, measured in kilowatts. Assuming that M has value $\mu$ just before a failure occurs, the survivability behavior is quantified by attributes such as the relaxation time for the system to restore the value of M to $\mu$. In this disclosure, metrics related to the relaxation time are computed, focusing on the mean energy not supplied per hour after a failure occurs.

FIG. 1 shows the taxonomy of the survivability related metrics considered in this disclosure. Metrics are classified into two broad categories. Instantaneous metrics are transient metrics that capture the state of the system at time t. An example of an instantaneous metric is the probability that a given section i has been recovered by time t.

Cumulative metrics are obtained in the inventive model by assigning reward rates to system states. A reward is gained per time unit in a state, as determined by the reward rate assigned to that state. The accumulated reward is the result of the accumulation of rewards since the failure up to time t or up to a certain event. The mean accumulated downtime of a given section by time t and the mean accumulated energy not supplied by time t are examples of cumulative metrics computed up to time t. The mean accumulated energy not supplied up to the full recovery of the system is an example of a cumulative metric computed up to a certain event occurs. The mean time to recover a given section is also an example of the latter class of metrics, where the accumulated reward in this case is the time itself, obtained by assigning a reward of one per time unit at every state.

Now, one of the key metrics of interest in the realm of power systems, SAIDI, will be defined and extended according to an exemplary embodiment of the present invention. SAIDI is an important measure of the power utility's ability to cope with recovery from failures. It is a measure of average customer impact of system interruptions as it computes the sum of customer interruption durations over the total number of customers.

Given a topology with C sections, let N be the total number of customers and let $N_j$ be the average number of customers in the system impacted by a failure at section j, j=1, ..., C.

Let $\varphi_j$ be the mean outage duration due to all failures that occur at section j, during a pre-established large observation period. The observation period is usually assumed to be one year.

Definition 1. The SAIDI index is the average outage duration for each customer served.

$$SAIDI = \sum_{j=1}^{C} \varphi_j \frac{N_j}{N} \quad (1)$$

There is a need to extend SAIDI for the smart-grid environment because in the smart-grid infrastructure the number of customers impacted by a service interruption and the energy not supplied are governed by dynamic automated processes during the recovery period.

After a failure, the energy not supplied will vary over time during a multi-step recovery process. Let $m_j(t)$ be a random variable characterizing the energy not supplied per unit time after a failure in section j, j=1, ..., C, t units of time after the failure. $m_j(t)$ accounts for the effect of one single failure in section j. Therefore, if a full system recovery occurs at time T, $m_j(t)=0$ for $t \geq T$. Let $\overline{m}j(t)$ be the mean value of $m_j(t)$.

Let $M_j(\tau)$ be the accumulated energy not supplied by time $\tau$ after a failure in section j, j=1, ..., C, $$\overline{M}j(\tau) = \int_{t=0}^{\tau} \overline{m}j(t)dt, j=1, \ldots, C \quad (2)$$

Note that the total energy demanded per unit time can also vary during recovery. This occurs, for instance, if demand response is integrated with failure recovery. Let $d_j(t)$ be a random variable characterizing the total energy demanded per unit time at time t during the recovery from a failure in section j. Let $D_j(\tau)$ be the energy demanded over the first $\tau$ time units during the recovery from a failure in section j, $$\overline{D}_j(\tau) = \int_{t=0}^{\tau} \overline{d}j(t)dt, j=1, \ldots, C \quad (3)$$

Let $\phi_j$ be the expected number of failures at section j during a pre-established large observation period (typically one year). The extended SAIDI index (ESAIDI) is defined as the outage duration accounting for the energy demanded and not supplied during the first $\tau$ units of time after a failure at a section, averaged over all sections.

Definition 2. The extended SAIDI index is given by $$ESAIDI(\tau) = \sum_{j=1}^{C} \phi_j \tau \left( \frac{\overline{M}j(\tau)}{\overline{D}_j(\tau)} \right) \quad (4)$$

The inventive model used to compute survivability metrics of power distribution systems is now presented.

The methodology presented herein relies on these key principles: state space factorization, flexibility, state aggregation and initial state conditioning. The methodology encompasses a set of models, where each model characterizes the system evolution after the failure of a given section. Given a topology with C sections, the methodology yields C models, where each model is tailored to the characteristics of the failed section. The advantages of such a space factorization include flexibility and reduced complexity as described below.

Flexibility: having a model tailored to a given section enables specific details to be captured about the impacts of failures on that particular section.

Figure 2:
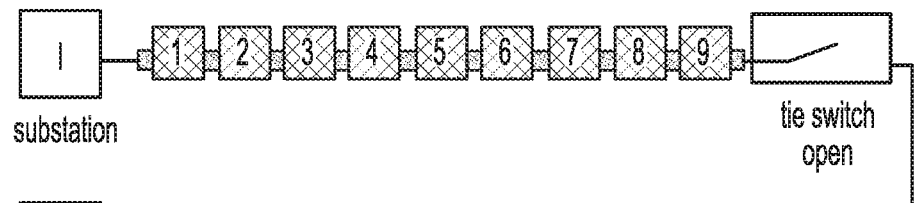
FIG. 2 illustrates a failed section and its upstream and downstream, according to an exemplary embodiment of the present invention.
Figure 2:
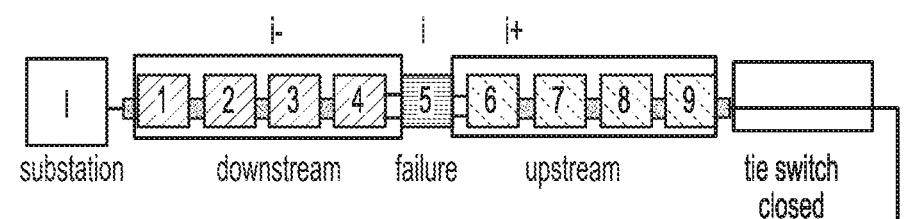
Figure 2:
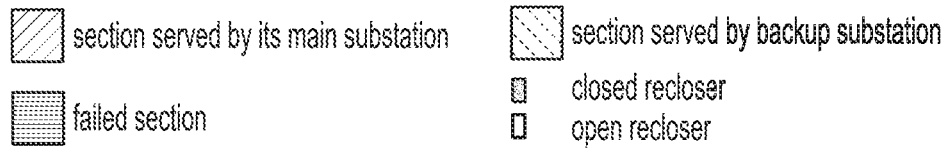

State aggregation. One of the insights of this disclosure is the observation that after a failure of a given section the remaining sections of the distribution automation topology can be aggregated into groups of affected and non-affected sections. In the scenario considered in the remainder of this disclosure, as shown in FIG. 2, after the failure of section i, section i is isolated and the non-failed sections can be aggregated into two groups: the downstream sections that are aggregated into a set of sections i− and are served by their original substation and the upstream sections that are aggregated into a set of sections i+ and might be served by a backup station, if enough backup power is available. State aggregation yields significant reduction in the computational complexity required to obtain the desired metrics, since the system state space can be described in terms of the aggregated section states.

Initial state conditioning. The computations of the metrics of interest are performed by assuming that the initial state is a failure state. The inventive models do not capture the failure rates of different components. Instead, the models are parameterized by using the conditional probability that specific system components are still operational after a specific section failure. In the remainder of this disclosure, conditional probabilities will be considered to account for the probability that a substation backup power is able to supply isolated sections (q), the reliability of the telecommunications network (p) and the effectiveness of the demand response application (r).

An overview of the inventive model is now provided.

Automatic and manual restoration events are initiated after a section failure event. The restoration process is a combination of electro-mechanical and computer-based events. In what follows, the sequence of events initiated after the failure of section i is described.

The isolation of the failed section is automatically performed by reclosers, within 10-50 ms after the failure, and power is instantaneously restored to the downstream sections (i−). The upstream sections (i+) have their power restored depending on the following factors: communication, backup power and demand response.

Communication. Communication is needed for all failure detection, isolation and recovery operations. In particular, communication is used by the supervisory control and data acquisition (SCADA) system at a substation to detect failure location, recalculate flow and close the tie switch to feed the upstream sections (i+).

Backup power. Sufficient spare backup power must be available at a backup substation.

Demand response. Demand response applications can reduce the load in the system after a failure, increasing the probability that the available backup power is able to supply energy to the upstream sections.

TABLE I

Model Parameters
(rates are given in units of events/hour)

| Parameter | Description | Value |
|---|---|---|
| $\epsilon$ | Mean time for recloser to isolate failed section | ≈0 |
| $\alpha$ | Automatic restoration rate | 30 |
| $\beta$ | Demand response rate | 4 |
| $\gamma$ | Communication repair rate | 1 |
| $\partial$ | Manual repair rate | ¼ |

After a section failure, if the communication system is available and the backup power is able to restore energy to the upstream sections, it takes an average of 1-2 minutes to execute the automated restoration feature (see Table I). If there is not enough available backup power for the restoration of upstream sections, but communication is available, the demand response feature might be used to adjust the demand accordingly. When the demand response is effective, demand of sections i+ can be lowered to the target values within 15 minutes on average. If the communication system is not available after the section failure, a 1 hour repair time is required for manual restoration of the communication system. This time is dominated by the time it takes for a truck to arrive at the failure site.

Finally, section i may require manual repair, e.g., to remove weather related damage and restore the damaged components to their original condition. After section i is repaired, if the upstream sections are still not recovered, these sections will be connected to the main substation through section i. The average time to manually repair a section is 4 hours.

A description of the inventive model is now provided.

TABLE II

Table of Notation

| Variable | Description |
|---|---|
| C | Number of sections |
| i | Failed section |
| i+ | Upstream of section i (sections $\{i + 1, \ldots, C\}$) |
| i− | Downstream of section i (sections $\{1, \ldots, i − 1\}$) |
| p | Probability that communication works after failure |
| q | Probability that backup power suffices to supply isolated sections |
| r | Probability that demand response is effective after failure |

Figure 3:
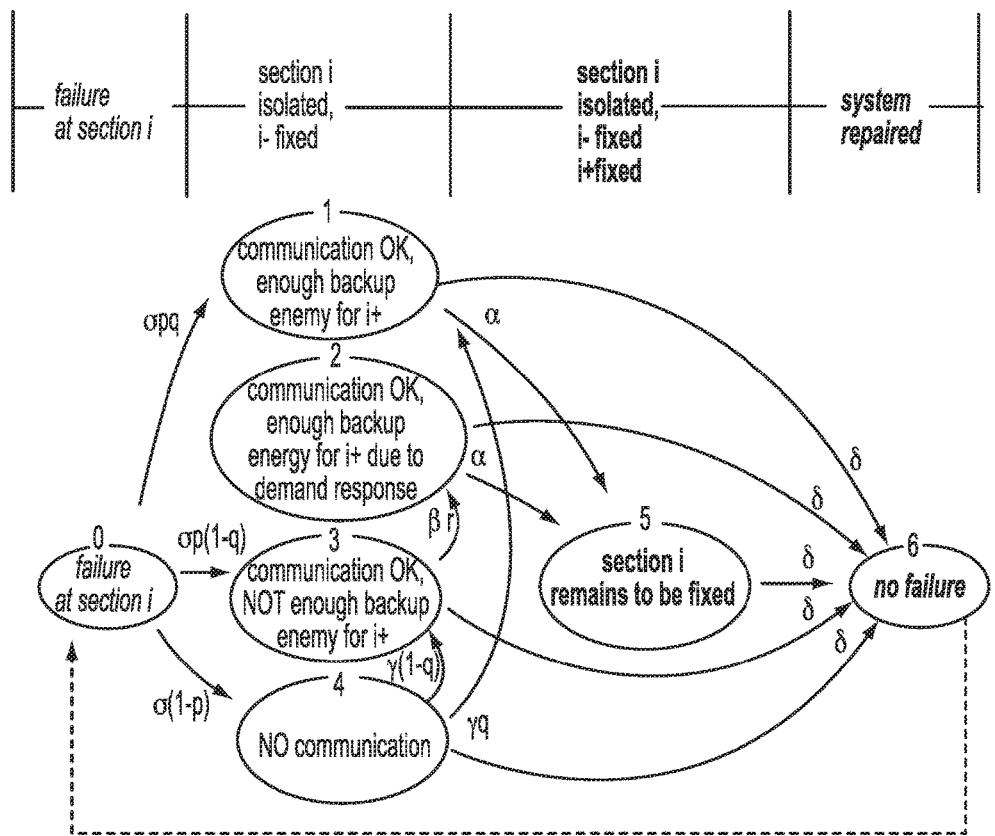
FIG. 3 illustrates a phased recovery model according to an exemplary embodiment of the present invention.

A Markov chain with rewards is used to model the phase recovery of the of the distribution automation network. The states of the model correspond to the different recovery phases at which the system might be found as shown in FIG. 3. Each state is associated with a reward rate that corresponds, for instance, to the energy not supplied per hour or the number of customers not served per hour in that state. In this disclosure, it is assumed that state residence times are exponentially distributed, which serves to illustrate the inventive methodology in a simple setting. The model may be extended to allow for general distributions for the state residence times. The system states and the state rewards are described in the following.

Phase recovery model. The phase recovery model is characterized by the following states and events.

As shown in FIG. 3, after a section failure, the model is initialized in state 0. The residence time at state 0 corresponds to the time required for the recloser to isolate the section, which takes an average of $\epsilon$. As mentioned prior, a recloser isolates a section within 10-50 ms after a failure, so in the remainder of this disclosure it is assumed $\epsilon$=0. Let p be the probability that the communication network is still operational after a section failure and q be the probability that there is sufficient backup power to supply energy for sections i+. After the isolation of section i is completed the model transitions to one of three states:

1) With probability pq the model transitions to state 1, where the distribution network is amenable to automatic restoration,
2) With probability 1−p, the model transitions to state 4, where the communication system requires manual repair, which occurs at rate $\gamma$, or
3) With probability p(1−q) the model transitions to state 3, where the effectiveness of demand response will determine if the system is amenable to automatic restoration.

At state 3, demand response takes place after a period of time with average duration $1/\beta$. Let r be the probability that demand response effectively reduces the load of the system to a level that is supported by the backup substation. In this case, the model transitions from state 3 to state 2 with rate $\beta r$. When the model is in states 1 or 2 the distribution network is amenable to automatic restoration, which occurs after a period of time with average duration $1/\alpha$. What distinguishes state 1 from state 2 is the fact that state 1 can be reached in one step transition after a failure, whereas state 2 is reached only after the successful activation of the demand response feature. Therefore, the state reward rates associated to states 1 and 2, such as the energy not supplied per hour at those states, are usually different. A manual repair of section i takes on average $1/\delta$ hours (and can occur while the system is in states 1-5). After a manual repair, the model transitions to state 6, which corresponds to a fully repaired system.

The computation of the survivability metric (Energy Not Supplied) will now be described by using the phase recovery model descried in FIG. 3. In each state of the model 700 the energy not supplied per hour at that state is associated as the state reward state. Let $\pi_k(t)$ be the transient probability associated with state k and $\sigma_k$ be the reward rate (e.g., mean energy not supplied per hour) associated with state k, k=0, ..., 6. Let L(t) be a random variable characterizing the reward accumulated time t after a failure (e.g., accumulated energy not supplied by time t). The mean reward accumulated by time t is $$\overline{L}(t) = \sum_{k=0}^{6} \int_{y=0}^{t} \sigma_k \pi_k(y) d_y \quad (5)$$

Let $s_k$ be the residence time at state k before reaching state 6 (i.e., up to full system recovery), k=0, ..., 5. Let L be a random variable characterizing the accumulated energy not supplied up to full system recovery. The mean reward accumulated up to full system recovery is $$\overline{L} = \lim_{t \to \infty} \overline{L}(t) = \sum_{k=0}^{5} \sigma_k \overline{s}k \quad (6)$$

Note that (5) is the mean energy not supplied in the interval [0,t] after a failure, is defined in (2).

Figure 4:
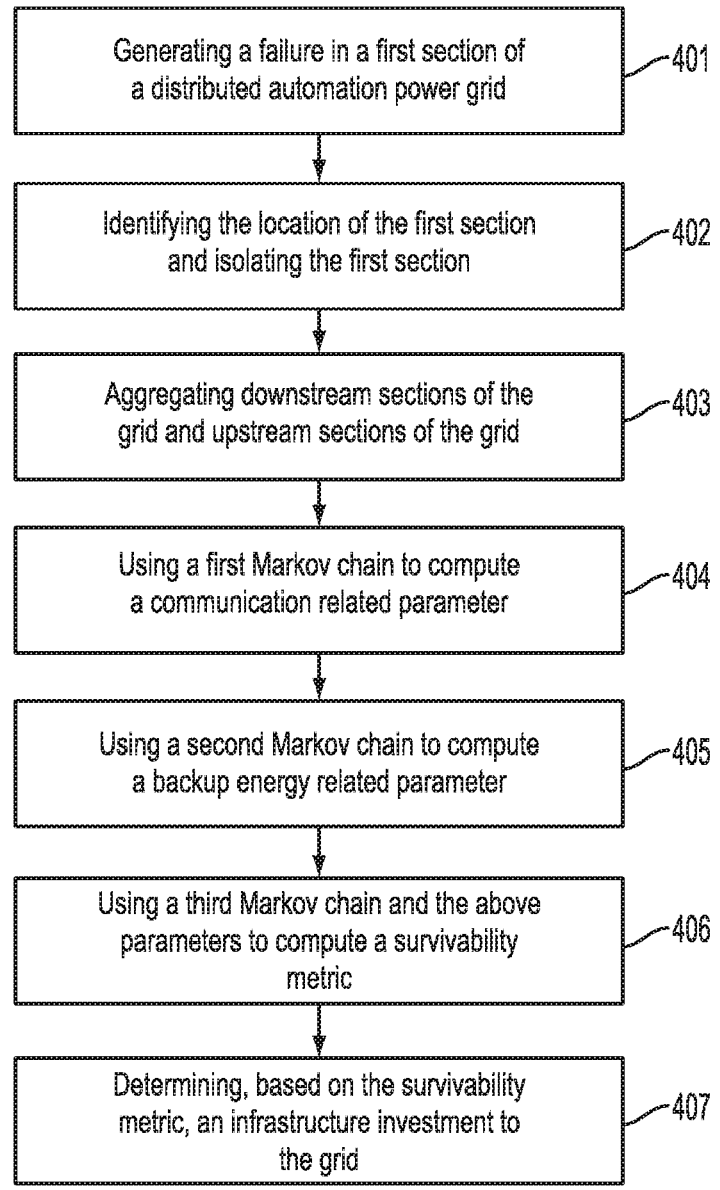
FIG. 4 is a flowchart illustrating an exemplary embodiment of the present invention.

FIG. 4 is a flowchart illustrating an exemplary embodiment of the present invention. Steps 401, 402 and 403 are related to the physical events impacting the state of the distribution automation network. As shown in FIG. 4, in step 401, a failure may be generated in a generic section i of a distributed automation power grid. As an example, section failures are usually caused by physical event (ice, down tree, summer storms, etc).

The failure may be in a generic section i in FIG. 2. In step 402, the location of the section i may be identified and isolated.

As discussed above, this process is fully automated and may occur in less than a second. In step 403, the sections of the grid that are downstream from the first section may be aggregated into a first group and the sections of the grid that are upstream from the first section may be aggregated into a second group. As shown in FIG. 2, the first group may be identified by i− and the second group may be identified by i+. This aggregation is done automatically by the electrical distribution network reclosers and takes much less than a second.

Step 404, 405, 406 and 407 are modeling steps used to compute the survivability metric.

In step 404, there is computed, using a first Markov chain, a first parameter indicating whether a communication network of the grid is operational after the failure. Communications are required to identify the failure location (section i). The first Markov chain may be referred to as a network communication failure based Markov chain for the distribution automation power grid. This Markov chain is used to compute the NetworkCommunicationIsOk parameter (first parameter) that is an input to the failure identification, isolation and restoration Markov chain (referred later to as the third Markov chain). The state of this Markov chain C is defined as the number of good paths between the distribution automation power grid and the distribution automation central controller. The transitions in this Markov chain represent communication path failures and communication path repairs. The NetworkCommunicationIsOk parameter is derived by computing the probability of C(1), i.e., the probability that at least one good network communication path exists between the distribution automation power grid and central controller.

At this time, with reference to FIG. 2, the downstream sections of the first group i− are served by substation I. The goal now is to determine if the upstream sections of the second group i+ can be served by backup substation II and, if not, how must the grid be reconfigured to provide these upstream sections with power in the event of an actual physical failure corresponding to the hypothetical one? This is accomplished by the following.

In step 405, there is computed, using a second Markov chain, a second parameter indicating whether enough backup energy exists for the second group after the failure. The second Markov chain may be referred to as a power demand Markov chain for the distribution automation power grid. This Markov chain is used to compute the AvailablePowerIsOk parameter (second parameter) that is an input to the failure identification, isolation and restoration Markov chain. The state of this Markov chain Q is defined as a difference between the available power for back-up failure restoration and the power demand in state Q. The transitions in this Markov chain represent changes in available back-up power due to initiation of additional back-up units (e.g. distributed generation or solar panels online) or due to reduced demand (e.g., activation of demand/response application, transition to off-peak configuration). The AvailablePowerIsOk parameter is derived by computing the summation of the probability of all states Q(I) for which I (the difference between available back-up power and required demand for failure restoration) is positive. Therefore, the AvailablePowerIsOk parameter is the probability that enough power exists in the back-up power supply to enable the successful execution of the automated failure restoration operation.

In step 406, there is computed, using a third Markov chain, a third parameter based on the first and second parameters, wherein the third parameter is indicative of the time required for the grid to be restored to its operating state prior to the failure. As mentioned above, the third Markov chain may be referred to as the failure identification, isolation and restoration Markov chain for the distributed automation power grid. This Markov chain is used to compute the Survivability metric. It uses as input the two parameters computed in steps 404 and 405: NetworkCommunicationIsOk and AvailablePowerIsOk. The state of this Markov chain F is defined by aggregating all the distribution automation power grid elements that have power related equivalent behavior in terms of failure isolation and restoration (section I impacted, NetworkCommunicationIsOk, AvailablePowerIsOk) and combinations of the above. The transitions in this Markov chain represent the rates at which changes in state of the failure isolation and restoration operations are performed: equivalent sections fixed or not fixed, demand response is activated, etc. The survivability parameter is computed by evaluating the time required to transition from the initial failure state to the state that represents the successful execution of the failure identification, isolation and restoration operation.

In step 407, based on the survivability metric, the power engineer may evaluate the required infrastructure investment to the distribution automation power grid network. For example, the power engineer may determine that the available back-up power in the network needs to be increased.

In this invention, introduced is a new approach for the evaluation of the likelihood of distributed automation power grid reliability survivability. In the above, we described the modeling approach to assess this metric. The approach consists of creating a power demand test suite and applying Markov modeling to the assessment of the power system survivability after the occurrence of a physical failure. The survivability test suite uses as input the list of the most likely failures and power load configurations. The output of the survivability testing phase is a metric that captures the required time for the power grid to return to correct operation after a physical failure. The distribution automation survivability metric is computed using three Markov chains, the power demand Markov chain, the network communications Markov chain, and the survivability Markov chain.

An exemplary function of this invention is to provide a tool to be used by power grid distribution automation engineers to assess the time required to recover from physical failures. Power engineers can use this tool to assess the reliability benefits of investing in the infrastructure for survivability. In addition, because the approach can be automatically executed, power engineers can also use the approach to dynamically track the survivability of their distributed automation power grids.

More specifically, by using this invention distribution automation power engineers will be able to automatically assess the investment tradeoffs involved in designing distribution automation power grids. Power engineers will be able to use the transient modeling approach to assess distribution automation power grid survivability after the occurrence of certain types of physical distribution automation failures. Power engineers will also be able to stochastically compute, using power demand based test case configurations, the survivability of power grid distribution automation systems.

The inventive method to assess the distributed automation power grid survivability condition on the occurrence of a physical failure shows superior performance because it has improved accuracy and efficiency.

As it pertains to accuracy, the test cases used for the evaluation of the survivability metric require detailed monitoring of demand and power availability. The survivability metric is computed for test cases representing the power demand defined usage and for each defined physical failure configuration. The distribution automation power grid survivability metric conditioned on the occurrence of a physical failure security shall be re-evaluated for significant changes in the available power generation sources and for significant changes in power demand.

As it pertains to efficiency, the derivation of a power demand test suite based on known power demand configurations and physical failures is an important advantage, as it allows the power engineer to focus on a significantly shorter list of likely physical failures. When new power demand types are introduced in the distribution automation power grid, the power demand test suite may be updated to account for the impact of these new demand types on the distribution automation power grid survivability.

The invention could also be generalized to automatically evaluate the required infrastructure investment to the distributed automation power grid network (as for example, increase the available back-up power), when the system survivability metric conditioned on physical distribution automation failures, (i.e., the time required for failure isolation, identification and restoration), crosses a pre-defined threshold. This generalization could require that this invention be applied to detect power demand and available power restoration capacity to detect demand response opportunities and back-up power shortages using online monitoring.

The inventive approach may be extended to incorporate reactive power into the holistic model for the assessment of large distributed automation power grids. In particular, reactive power is incorporated into the survivability Markov chain and the power demand/response Markov chain.

This extension uses the same network communication failure based Markov chain as described above, but extends the power demand Markov chain and failure identification, isolation and restoration Markov chain as follows.

Power demand Markov chain for the distribution automation power grid. This Markov chain is used to compute the AvailablePowerIsOk parameter that is an input to the failure identification, isolation and restoration Markov chain. This state of this Markov chain Q (active, reactive) is defined as difference between the available (active, reactive) power for back-up failure restoration and the (active, reactive) power demand in state Q (active, reactive). The transitions in this Markov chain represent changes in available back-up power due to initiation of additional active/reactive back-up units (e.g., distributed generation or solar panels online) or due to reduced demand (e.g., activation of demand/response application to reduce active or reactive power demand, transition to off-peak configuration). The AvailablePowerIsOk (active, reactive) parameter is derived by computing the summation of the probability of all states Q (active, reactive) (I) for which I (the difference between available active/reactive back-up power and required demand for failure restoration) is positive. Therefore, the AvailablePowerIsOk (active, reactive) parameter is the probability that enough power exists in the back-up active and reactive power supplies to enable the successful execution of the automated failure restoration operation.

Figure 5:
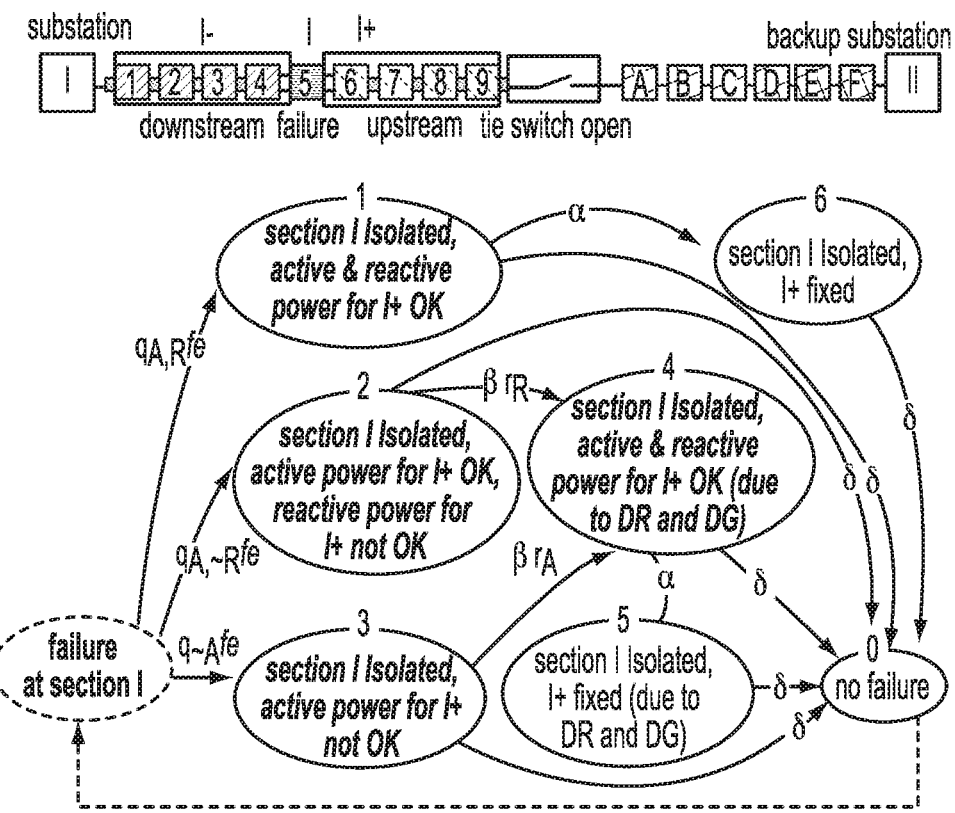
FIG. 5 illustrates a phased recovery model according to an exemplary embodiment of the present invention.

An implementation of a specific instance of the failure identification, isolation and restoration Markov chain for the distribution automation power grid is shown in FIG. 5. This Markov chain is used to compute the Survivability metric. It uses as input the two parameters computed in the network communication failure based Markov chain and the power demand Markov chain: NetworkCommunicationIsOk (p) and AvailablePowerIsOk (active, reactive): (qa, qr). The state of this Markov chain F is defined by aggregating all the distribution automation power grid elements that have power related equivalent behavior in terms of failure isolation and restoration (section I impacted, NetworkCommunicationsIsOk, AvailablePowerIsOk (active, reactive)) and combinations of the above. The transitions in this Markov chain represent the rates at which changes in state of the failure isolation and restoration operations are performed: equivalent sections fixed or not fixed, demand response is activated, etc. The survivability parameter is computed by evaluating the time required to transition from the initial failure state to the state that represents the successful execution of the failure identification, isolation and restoration operation. Other parameters used to specify the Markov chain are rates of transitions between states when repairs are possible: automated repair (alpha), demand response activated successfully (beta), manual repair (delta), high rate of transition from failure state (sigma).

FIG. 5 will now be described in detail.

After a failure at section i, power might become unavailable in other sections of the system due to cascading effects. The set of additional sections affected by a failure at section i are referred to as the upstream of i, or i+. A tie switch is used to control the flow of energy from a backup substation to i+.

Both electro-mechanical and computer-based strategies are used to address failures in an integrated manner. It takes an average of $\in$ units of time for the failed section to be isolated. As the time for a section to be isolated is negligible, $\in = 0$.

After section i is isolated, the system transitions to states $s_1$, $s_2$ or $s_3$, depending on whether there is enough active and reactive power available to supply the upstream sections. If there is enough energy to supply i+ (state $s_1$), a tie switch is closed, energy is automatically restored, and the system transitions to state $s_6$ at rate $\alpha$. Otherwise (states $s_2$ and $s_3$), the demand response and distributed generation programs are activated, and it takes on average $1/\beta$ for them to take place. Such programs are effective with probability $r_R$ and $r_A$ at states $s_2$ and $s_3$, respectively. In case they are effective, a tie switch is closed and the system transitions from state $s_2$ and $s_3$, respectively, to state $s_4$. In state $s_4$, the upstream sections can be automatically restored. As in state $s_1$, the automatic restoration rate at state $s_4$ is $\alpha$. At states $s_5$ and $s_6$, only section i remains to be fixed. The manual repair rate occurs at rate $\delta$. A manual repair can take place from every state of the model, and yields a transition to state $s_0$ (full system recovery).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, radio frequency (RF), etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article or manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 6:
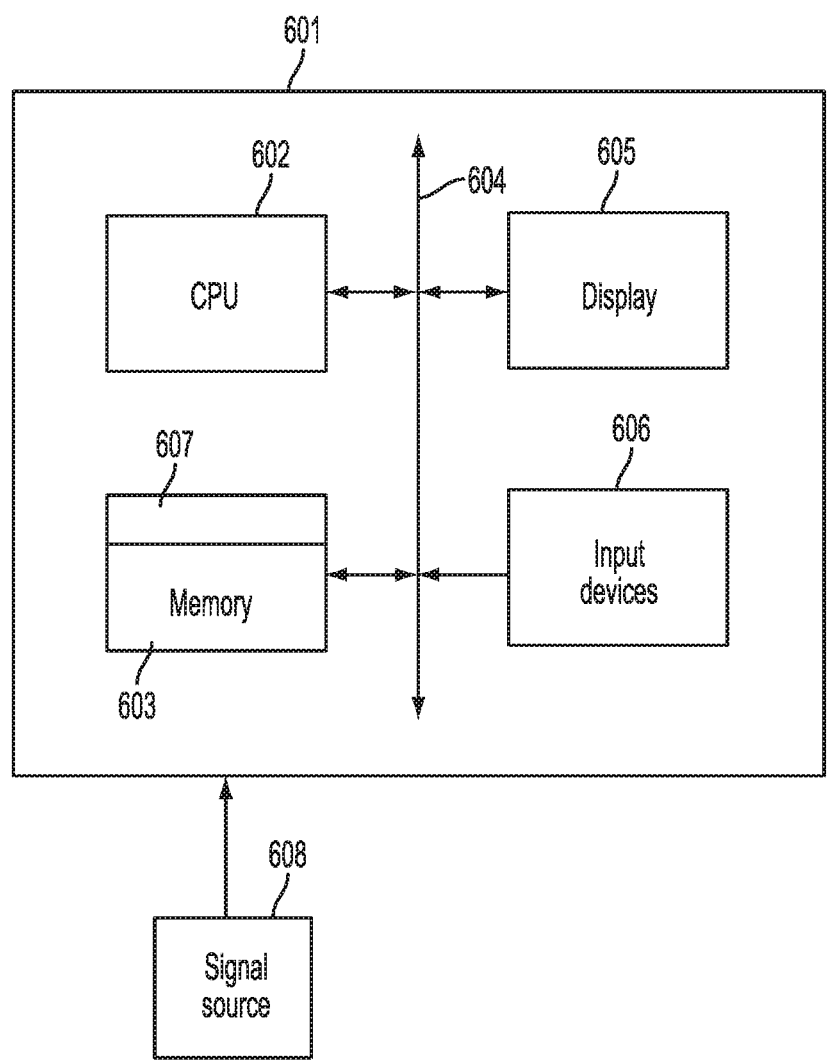
FIG. 6 illustrates a computer system in which an exemplary embodiment of the present invention may be implemented.

Referring now to FIG. 6, according to an exemplary embodiment of the present invention, a computer system 601 can comprise, inter alia, a central processing unit (CPU) 602, a memory 603 and an input/output (I/O) interface 604. The computer system 601 is generally coupled through the I/O interface 604 to a display 605 and various input devices 606 such as a mouse and keyboard. The support circuits can include circuits such as cache, power supplies, clock circuits, and a communications bus. The memory 603 can include RAM, ROM, disk drive, tape drive, etc., or a combination thereof. Exemplary embodiments of present invention may be implemented as a routine 607 stored in memory 603 (e.g., a non-transitory computer-readable storage medium) and executed by the CPU 602 to process the signal from a signal source 608. As such, the computer system 601 is a general-purpose computer system that becomes a specific purpose computer system when executing the routine 607 of the present invention.

The computer system 601 also includes an operating system and micro-instruction code. The various processes and functions described herein may either be part of the micro-instruction code or part of the application program (or a combination thereof) which is executed via the operating system. In addition, various other peripheral devices may be connected to the computer system 601 such as an additional data storage device and a printing device.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described to best explain the principles of the invention and the practical application, and to enable others of ordinary skill in the art to understand the invention for various embodiments with various modifications as are suited to the particular use contemplated.

Optimization of Distribution Automation Networks Using the Survivability Model to Support Storm Hardening A holistic optimization approach is presented below for the assessment of the impact of multiple distribution automation failures after a major storm. The approach is designed to be used by power grid engineers for the holistic assessment of system survivability after a major distribution automation failure event that causes multiple failures. For example, physical damage to several line feeders may result from a severe ice or wind storm. The approach uses a three-layer hierarchical decomposition model comprising an optimization model, a power routing model, and a survivability model. The optimization model maximizes the probability of having sufficient resources for failure recovery per dollar of investment. The power routing model is used to evaluate the marginal benefit of investment into redundant distribution automation routing. The survivability model is used to evaluate the survivability metric after each investment step.

The function of the presently described technique is to optimize the survivability of distribution automation networks to survive medium to large ice and wind storms, under investment and technological constraints, using the above three models. The technique allows for the optimization, at design time, of the power grid survivability metric to assess the recovery time after multiple failures. Survivability in this case is defined as the time required for identifying and restoring the distribution automation power grid to a correct operating state; i.e. the state prior to the failure. The technique integrates optimization, power routing and survivability modeling.

In the present disclosure, a new modeling layer is added around the survivability Markov chain introduced above to incorporate power routing and use the results of the power routing modeling to optimize survivability after a multiple failure event. The result is a holistic optimization tool to be used by power grid engineers to create optimal distribution automation topologies.

Power routing algorithms are used in the present disclosure to assess the impact of multiple failures on the distribution automation network topology. Power routing algorithms are additionally used to identify the costs and benefits of investments in redundant routing for network upgrades, and in the use of transient analysis to assess the impact of these resource upgrades on the distribution network survivability.

By using the presently described technique, distribution automation power engineers are able to automatically identify the best places to invest in redundant routing when designing distribution automation power grids. The presently described stochastic model of multiple failures and back-up restoration enables engineers to efficiently identify the best places for resource investments that provide the most benefit to the survivability of the distribution automation network.

The described approach optimizes a survivability metric for distribution automation networks after multiple physical failures, under investment and technological constraints. The technique includes the use of the interactive solution of the three models described above: an optimization model, a power routing model, and a survivability model.

Figure 7:
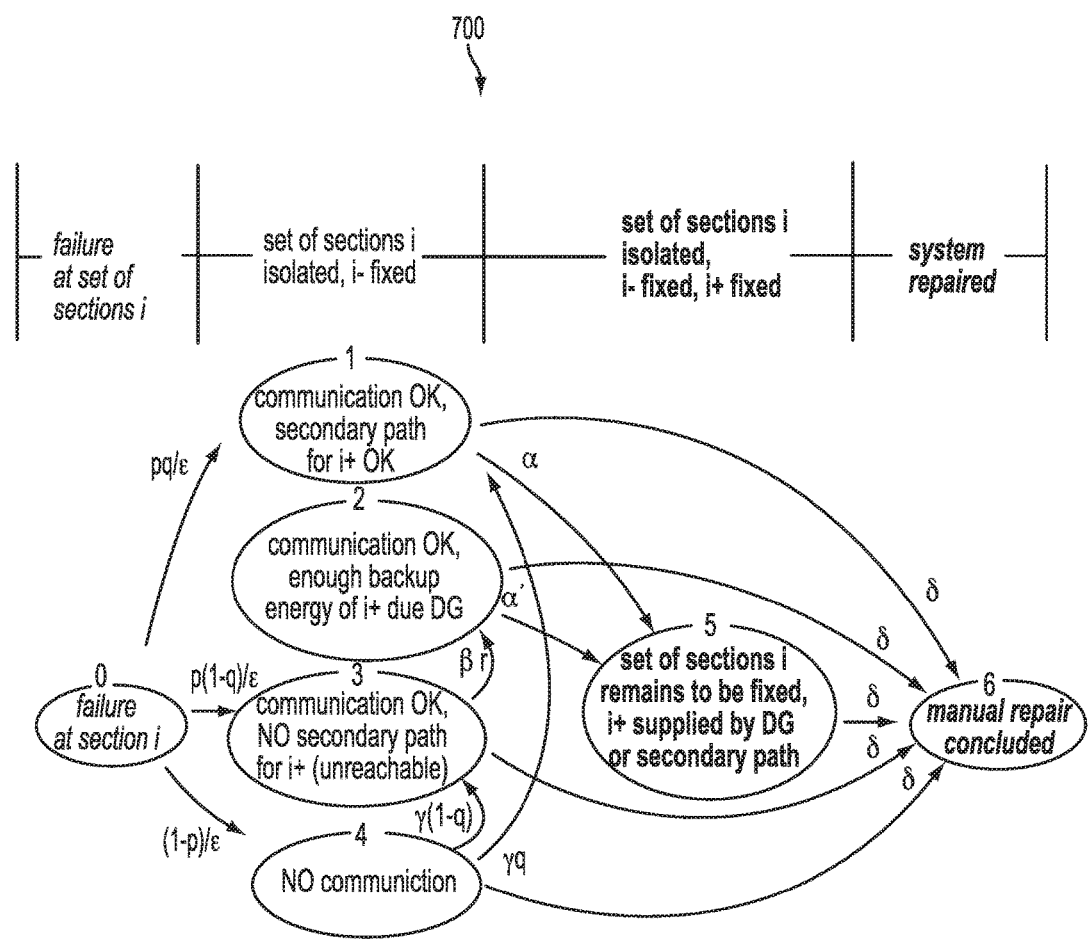
FIG. 7 illustrates a phased recovery model in accordance with one embodiment of the invention.

A Markovian survivability model or phase recovery model 700 reflecting the failure of multiple sections will now be described with reference to FIG. 7. The phased recovery model is characterized by the following states and events. After a failure of a set of sections, the model is initially in state 0. The sojourn time in state 0 corresponds to the time required for the recloser to isolate the section, which takes an average of $1/\varepsilon$ time units. A recloser isolates a section within 10-50 ms after a failure, so in the remainder of this disclosure it is assumed $\varepsilon = \infty$. Let p be the probability that the communication network is still operational after a section failure, and let q be the probability that there is a secondary path to supply energy for sections i+. After the isolation of sections i is completed, the model transitions to one of following three states:

State 1: With probability pq the model transitions to state 1, where the communication system is intact and there is a secondary path to the affected nodes. The distribution network is amenable to automatic restoration.

State 3: With probability p(1−q) the model transitions to state 3, where the communication system is intact, but no secondary path to the affected nodes is available. The effectiveness of distributed generation will determine if the system is amenable to automatic restoration.

State 4: With probability 1−p, the model transitions to state 4, where the communication system requires manual repair, which occurs with rate $\gamma$.

In state 3, distributed generation is activated after a period of time with average duration $1/\beta$. Let r be the probability that distributed generation can effectively be used. In that case, the model transitions from state 3 to state 2 with rate $\beta r$. When the model is in state 1 or state 2, the distribution network is amenable to automatic restoration, which occurs after a period of time with average duration $1/\alpha$ and $1/\alpha'$, respectively. A manual repair of section i takes on average $1/\delta$ units of time (and can occur while the system is in any of states 1-5). After a manual repair, the model transitions to state 6, which corresponds to a fully repaired system.

Figure 8A:
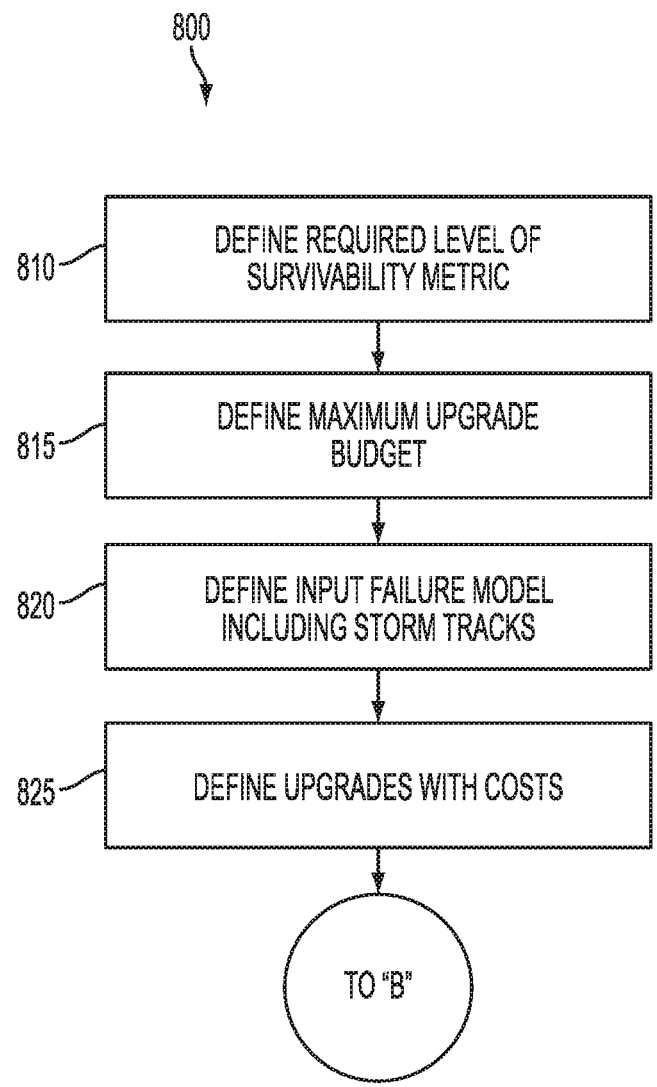
FIG. 8A is a flow chart illustrating methods in accordance with embodiments of the invention.

A technique 800 in accordance with the disclosure will now be described with reference to the flow chart shown in FIGS. 8A, 8B and 8C.

At operation 810, the distribution automation survivability metric required level is defined for a given observation period. The metric may be defined as the time required for the power grid distribution automation system to satisfy the defined power grid performance requirements specifications after the occurrence of multiple physical failure impacting active and reactive power generation. The transient solution of the survivability model 700 (FIG. 7) is used for the evaluation of the distribution automation survivability metric. The metric may be defined as an instantaneous metric, such as the probability that all sections have their power recovered by time t. Alternatively, the metric may be defined as an accumulated metric, such as the mean accumulated energy not supplied by time t.

Returning to FIG. 8, a maximum investment or budget for an upgrade of the distribution automation network is defined at operation 815. Specifically, the budget is a maximum investment (in currency units) available for the upgrade of the distribution automation network to achieve the required level of survivability defined in operation 810.

An input distribution failure model is next defined in operation 820 as pairs of (r,c) obtained from historical traces of large storms that have hit the given geographical area under study. r is the radius of the storm disk and c is the center of the storm. In operation 825, the types and costs of power routing resources or other measures for storm hardening are identified. The operation lists the types and costs (in currency units) of the resources that can be used to upgrade the distributed network topology for storm hardening. Examples of such resources are underground routing, tree trimming, animal guards, or the build-up of additional power routing.

Figure 8B:
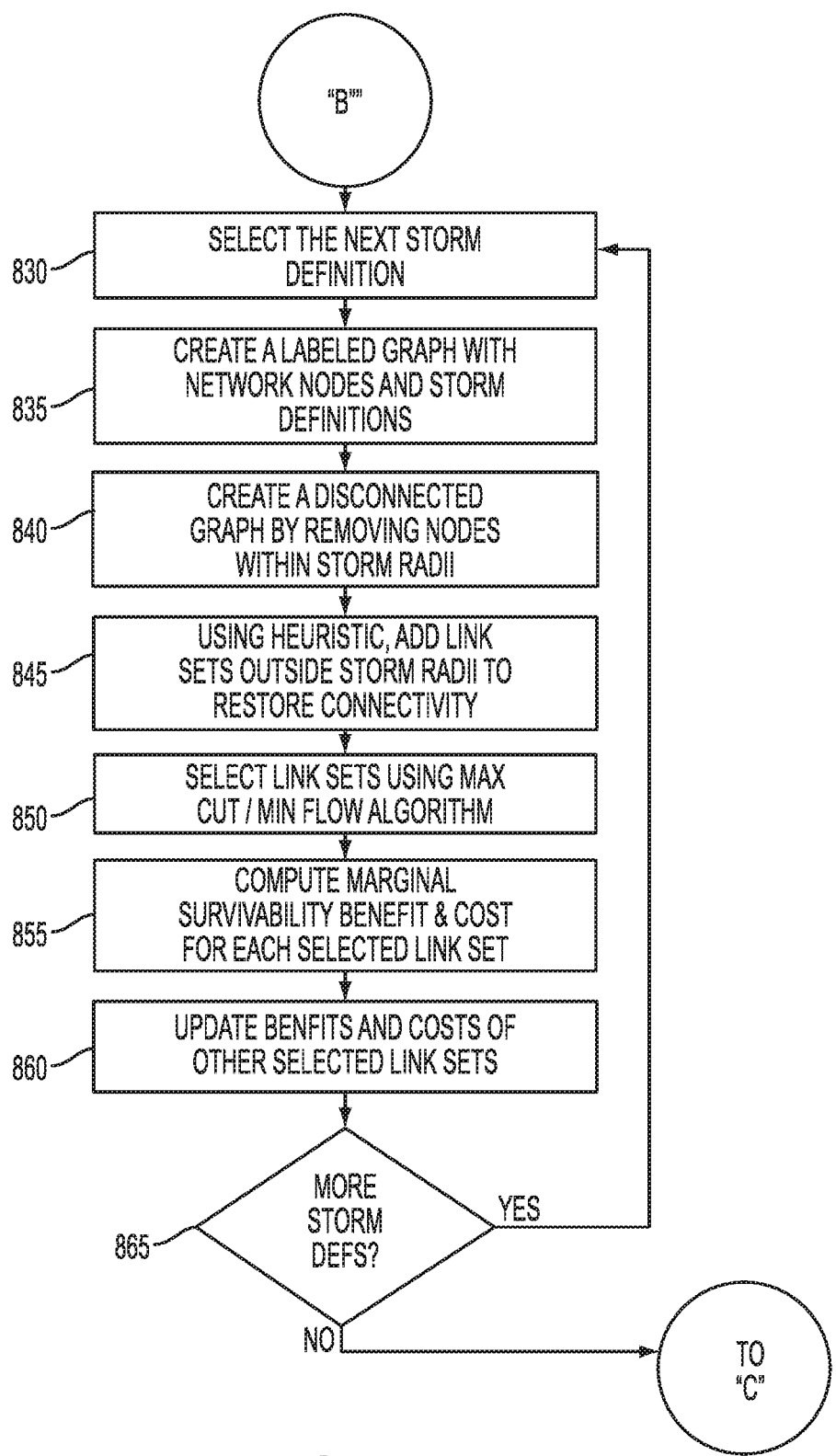
FIG. 8B is a flow chart illustrating methods in accordance with embodiments of the invention.
Figure 8C:
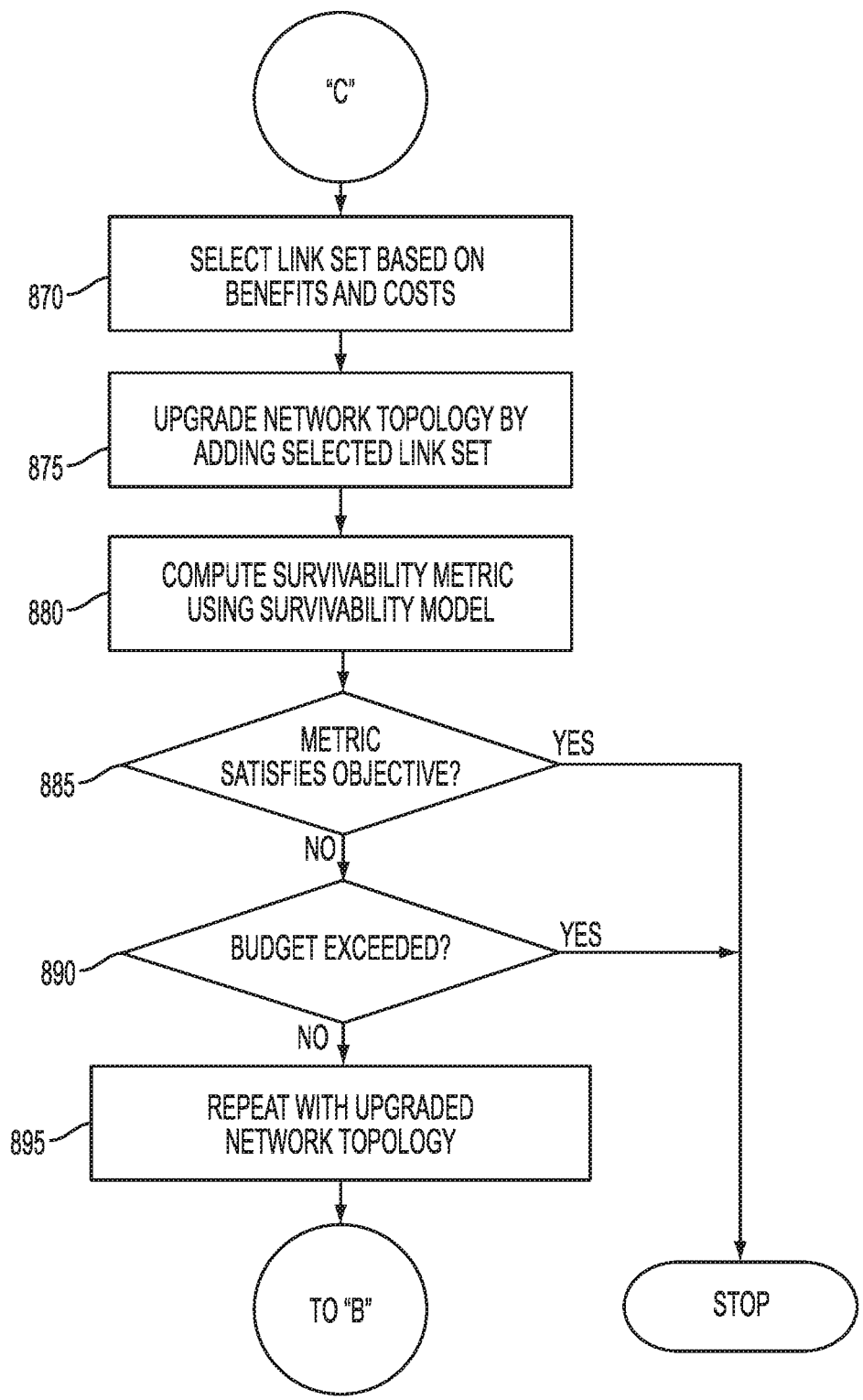
FIG. 8C is a flow chart illustrating methods in accordance with embodiments of the invention.

The procedure shown in FIG. 8B is then performed for each pair (r,c) describing a historical storm, selecting each storm in turn as indicated in operation 830. The distribution automation power grid map under study is mapped at operation 835 into a labeled graph, where each label represents a distance in terms of failure susceptibility of a node as a function of a storm radius of impact (r) and storm center (c) in the graph. This resulting labeled graph is called G_labeled.

The susceptibility of a given distribution automation power grid node to a given storm also depends on the storm strength or wind strength. The susceptibility of a node is characterized by the probability that the node will be affected by a given storm. Table III shows the different wind strength levels considered in this work and examples of possible probability assignments of failure $\psi(w)$ as a function of wind strength W.

TABLE III

Wind Strength Levels

| w | Classification | Knots | $\psi(w)$ |
|---|---|---|---|
| 1 | Small | <34 | 0.1 |
| 2 | Medium | [34, 64) | 0.3 |
| 3 | Large | [64, 74) | 0.7 |
| 4 | Catastrophic | ≥74 | 1.0 |

In addition to depending on the storm characteristics, the labels to be added to the graph depend on the type of storm hardening implemented in the link, such as whether the section is underground and whether trees were trimmed, and on the actual geographical distance from the storm center. At each section, the probability of failure must be adjusted to account for the fact that sections are underground and/or trees were trimmed.

Figure 9:
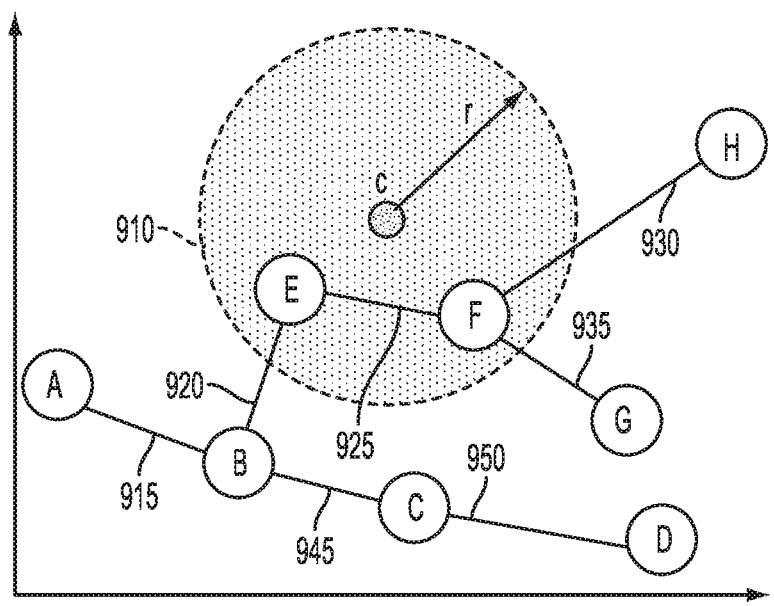
FIG. 9 is a representation of a labeled graph showing a storm and power distribution network in accordance with embodiments of the invention.

An exemplary labeled graph G_labeled is shown in FIG. 9. The power distribution network nodes A through H are connected by edges or links. Two nodes E and F, together with several links, lie within or partially within the storm impact area 910 defined by (r,c).

Figure 10:
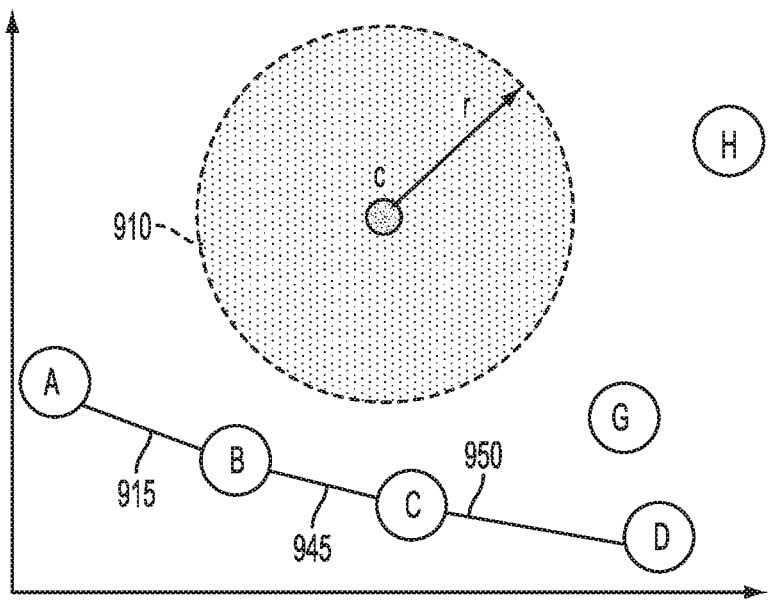
FIG. 10 is a representation of a labeled graph showing a disconnected power distribution network in accordance with embodiments of the invention.

Returning to FIG. 8B, a disconnected graph G_disconnected is then obtained at operation 840. The disconnected graph G_disconnected results from processing input graph (G_labeled) obtained in operation 835 above by removing all nodes at radius r from center c from G_labeled. An exemplary disconnected graph obtained from the labeled graph of FIG. 9 is shown in FIG. 10. Nodes E and F, which were within the storm impact area 910 as shown in FIG. 9, together with connecting links 920, 925, 930, 935, have been removed in the disconnected graph of FIG. 10. It can be seen that nodes G and H are now disconnected.

Links sets (l_r) are added at operation 845 (FIG. 8B) outside of the (r,c) storm impact area 910 to G_labeled to restore connectivity to G_labeled using predefined heuristics. For example, a possible heuristic is to minimize the cost of (l_r). Another possible heuristic is to maximize the reward from (l_r) (number of customers restored, or maximize energy supplied restored). Yet another possible heuristic is the maximization of the ratio of reward_r/cost_r. Each instantiation of the described technique focuses on only one of those heuristics, or one combination of heuristics, based on customer requirements, as each utility might be optimizing for different metrics according to regulatory needs and capital expense requirements.

Figure 11:
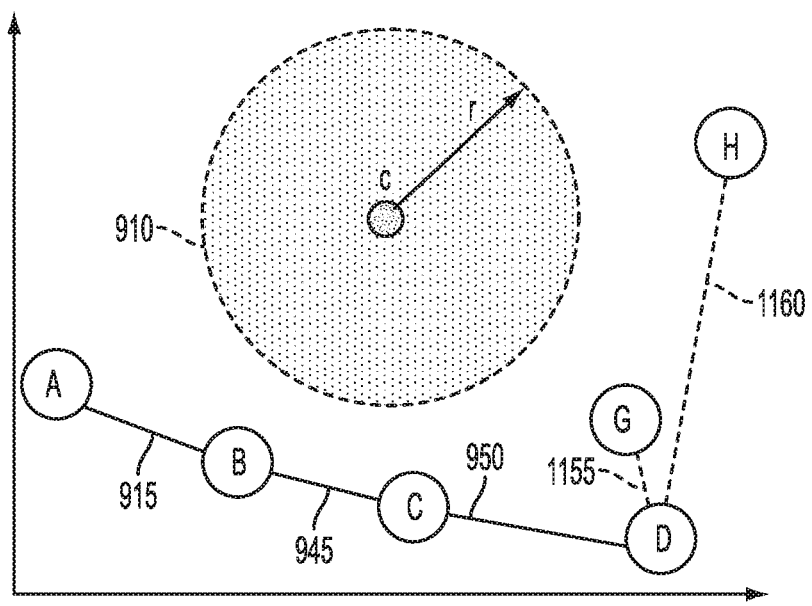
FIG. 11 is a representation of a labeled graph showing a reconnected power distribution network in accordance with embodiments of the invention.

In the exemplary power distribution network shown in FIG. 11, a link set including two links 1155, 1160 have been added to the network to reconnect the nodes G, H. The links 1155, 1160 are outside the storm impact area 910.

Returning to FIG. 8B, the technique at operation 850 now reviews all pairs (r,c) representing storms, and obtains link sets (l_r) using a min cut/max flow algorithm such as that described in by Neuymayer et al., Geographic Max-Flow and Min-Cut Under a Circular Disk Failure Model, IEEE Infocom 2012.

For each link set (l_r) selected to be added to graph G_disconnected, the marginal survivability benefit (ms_lr) of adding link set l_r, together with the associated cost (cost_lr), are obtained at operation 855. The average metrics (ms_lr, cost_lr) are updated at operation 860 for each link based on the sample (r,c) results.

Operations 830 through 860 are repeated for each of the sample storm definitions (r,c). When all storm definitions have been processed (decision 865), the procedure continues.

At operation 870 (FIG. 8C), a link set is selected for upgrade based on the average metrics computed at operation 860 and the defined optimization heuristic. The distribution network topology is then upgraded at operation 875 by adding the link sets identified in operation 870.

A survivability metric is then computed at operation 880 for the distributed automation topology generated using the survivability model. If the survivability level of the power distribution network satisfies the objective (decision 885), then the process stops. Similarly, if the available investment budget is exhausted (decision 890), then the process stops. Otherwise, the sequence is repeated (operation 895) with the new topology beginning at operation 830.

Several factors render the method presented in this disclosure more accurate than presently used techniques. First, the survivability metric is computed for the several topologies using the defined place and radius of documented storms that have affected a given area. That makes the resulting grid upgrades more likely to be effective against damage caused by future storms.

Improved accuracy also results from the holistic approach that takes into account several distribution automation models: power routing, active and reactive power resources and stability evaluation. Optimization algorithms can quickly identify the lowest cost of investment places for resource upgrades.

The conditioning on the occurrence of multiple-failure events, and the use of transient models of survivability, allows for better accuracy in modeling the benefits of investments on the multiple failure recoveries that are typical of large storms. Most engineering models use average failure rates and therefore do not accurately capture the impact of investment on multiple-failure recovery, as multiple-failures are rare events and it is very difficult to model rare events.

The use of the active and reactive power demand profile for the evaluation of the distribution automation topologies based on known active and reactive power demand configurations and multiple physical failures improves accuracy, as it allows the optimization algorithm to focus on the min cut/max flow topologies to create topologies for stability evaluation, and to accurately replicate the physical environment that will be generated after the simultaneous failure of multiple sections.

Several factors make the method presented in this disclosure more efficient than presently used techniques. For example, performance of the optimization algorithm is improved by using analytical solutions to the survivability model to evaluate different investment options.

The convergence of the optimization algorithm is improved because the max flow/min cut algorithms are combined with electrical engineering power flow analysis and analytical modeling of survivability. The selection of the best upgrade path is efficient because the stability analysis of several topological configurations is used to identify the optimal resource upgrade place.

The solution is made efficient and customizable because it is possible to focus on specific regulations by selecting the heuristics that fit a given regulatory environment. In addition, it is possible to focus on power flow, power routing, or both, as criteria to drive the optimization.

Although various embodiments that incorporate the teachings of the present invention have been shown and described in detail herein, those skilled in the art can readily devise many other varied embodiments that still incorporate these teachings. The invention is not limited m its application to the exemplary embodiment details of construction and the arrangement of components set forth in the description or illustrated in the drawings. The invention is capable of other embodiments and of being practiced or of being carried out in various ways. For example, embodiment may automatically optimize the required infrastructure investment to the distribution automation power grid network (for example, by increasing the available back-up active and reactive power or decreasing the demand using demand/response), when the system survivability metric, which is conditioned on physical distribution automation failures (i.e., the time required for failure isolation, identification and restoration), crosses a pre-defined threshold. In that case, the technique would detect active and reactive power demand and available active and reactive power restoration capacity to detect demand response opportunities and back-up power shortages using online monitoring.

Also, it is to be understood that the phraseology and terminology used herein is for the purpose of description and should not be regarded as limiting. The use of "including," "comprising" or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings.

What is claimed is:

1. A method for selecting improvements to an original distributed automation power grid to improve storm survivability, the method comprising:
   (a) identifying the original distributed automation power grid as a current circuit;
   (b) by a processor, based on a topology and a geography of the current circuit, and further based on information describing a plurality of historical storms, determining a link set associated with one of the plurality of historical storms, and determining costs and marginal survivability benefits associated with each link set, each link set representing links that would restore connectivity of the current circuit after damage by the associated storm;
   (c) based on the costs and benefits, selecting a link set from the plurality of link sets;
   (d) updating the current circuit by adding the selected link set to the current circuit to define a new circuit, and updating the costs and benefits of others of the plurality of link sets;
   (e) by the processor, creating a phased-recovery survivability model of the current circuit;
   (f) by the processor, determining a distribution automation survivability metric for the current circuit using the phased-recovery survivability model;
   (g) replacing the current circuit with the new circuit and repeating the operations (b) through (f) until the distribution automation survivability metric of the current circuit meets a target distribution automation survivability metric; and
   (h) selecting link sets to be added to the current circuit as improvements to the original distributed automation power grid to improve storm survivability, wherein the information describing the plurality of historical storms comprises, for each storm, a storm radius of impact and a storm center, and wherein determining a link set associated with each storm further comprises performing the following for each storm:
   mapping a representation of the current circuit into a labeled graph, wherein labels of the labeled graph represent susceptibilities of nodes as a function of the storm radius of impact and the storm center;
   obtaining a disconnected graph by removing nodes of the labeled graph within the storm radius of impact around the storm center; and
   determining the link set associated with the storm by determining a set of links outside the storm radius of impact around the storm center that, when added to the disconnected graph, restore connectivity.

2. A method as in claim 1, wherein determining a plurality of link sets comprises determining a set of links according to a heuristic selected from the group of heuristics consisting of: a minimum cost of the set of links, a maximum number of customers restored, a maximum energy supplied restored, and a maximum ratio of reward to cost.

3. A method as in claim 1, determining a plurality of link sets is performed using a min cut/max flow algorithm.

4. A method as in claim 1, wherein creating a phased-recovery survivability model of the current circuit further comprises creating a Markovian phased-recovery survivability model.

5. A method as in claim 1, further comprising:
terminating the repeating the operations (b) through (f) when a cost of selected link sets exceeds a predetermined budget cost.

6. A method as in claim 1, wherein determining a plurality of link sets includes estimating damage caused by the associated storm based on whether storm hardening is implemented in links of the current circuit.

7. A method as in claim 1, wherein the distribution automation survivability metric of the current circuit is an instantaneous metric.

8. A method as in claim 7, wherein the instantaneous metric is a probability that all sections of the current circuit will have power restored by a predetermined time.

9. A method as in claim 1, wherein the distribution automation survivability metric of the current circuit is an accumulated metric.

10. A method as in claim 9, wherein the accumulated metric is a mean accumulated energy not supplied by a predetermined time.

11. A non-transitory computer-usable medium having computer readable instructions stored thereon that, when executed by a processor, cause the processor to perform operations for selecting improvements to an original distributed automation power grid to improve storm survivability, the operations comprising:
(a) identifying the original distributed automation power grid as a current circuit;
(b) based on a topology and a geography of the current circuit, and further based on information describing a plurality of historical storms, determining a plurality of link sets, each link set associated with one of the plurality of historical storms, and determining costs and marginal survivability benefits associated with each link set, each link set representing links that would restore connectivity of the current circuit after damage by the associated storm;
(c) based on the costs and benefits, selecting a link set from the plurality of link sets;
(d) updating the current circuit by adding the selected link set to the current circuit to define a new circuit, and updating the costs and benefits of others of the plurality of link sets;
(e) creating a phased-recovery survivability model of the current circuit;
(f) determining a distribution automation survivability metric for the current circuit using the phased-recovery survivability model;
(g) replacing the current circuit with the new circuit and repeating the operations (b) through (f) until the distribution automation survivability metric of the current circuit meets a target distribution automation survivability metric; and
(h) selecting link sets to be added to the current circuit as improvements to the original distributed automation power grid to improve storm survivability, wherein the information describing the plurality of historical storms comprises, for each storm, a storm radius of impact and a storm center, and wherein determining a link set associated with each storm further comprises performing the following for each storm:
mapping a representation of the current circuit into a labeled graph, wherein labels of the labeled graph represent susceptibilities of nodes as a function of the storm radius of impact and the storm center;
obtaining a disconnected graph by removing nodes of the labeled graph within the storm radius of impact around the storm center; and
determining the link set associated with the storm by determining a set of links outside the storm radius of impact around the storm center that, when added to the disconnected graph, restore connectivity.

12. A non-transitory computer-usable medium as in claim 11, wherein creating a phased-recovery survivability model of the current circuit further comprises creating a Markovian phased-recovery survivability model.

13. A non-transitory computer-usable medium as in claim 11, wherein the operations further comprise:
terminating the repeating the operations (b) through (f) when a cost of selected link sets exceeds a predetermined budget cost.

14. A non-transitory computer-usable medium as in claim 11, wherein determining a plurality of link sets includes estimating damage caused by the associated storm based on whether storm hardening is implemented in links of the current circuit.

15. A non-transitory computer-usable medium as in claim 11, wherein the distribution automation survivability metric of the current circuit is an instantaneous metric.

16. A non-transitory computer-usable medium as in claim 15, wherein the instantaneous metric is a probability that all sections of the current circuit will have power restored by a predetermined time.

* * * * *